(12) United States Patent
Birnkrant et al.

(10) Patent No.: US 11,361,121 B2
(45) Date of Patent: Jun. 14, 2022

(54) IMPLEMENTATION OF FIBER HIGH-SENSITIVITY SMOKE DETECTOR SYSTEM UTILIZING A BUILDING INFORMATION MODEL

(71) Applicant: Carrier Corporation, Palm Beach Gardens, FL (US)

(72) Inventors: Michael J. Birnkrant, Wethersfield, CT (US); Jie Xi, Shanghai (CN)

(73) Assignee: CARRIER CORPORATION, Palm Beach Gardens, FL (US)

( * ) Notice: Subject to any disclaimer, the term of this patent is extended or adjusted under 35 U.S.C. 154(b) by 145 days.

(21) Appl. No.: 16/632,507

(22) PCT Filed: Jul. 19, 2018

(86) PCT No.: PCT/US2018/042794
§ 371 (c)(1),
(2) Date: Jan. 20, 2020

(87) PCT Pub. No.: WO2019/018590
PCT Pub. Date: Jan. 24, 2019

(65) Prior Publication Data
US 2021/0165925 A1    Jun. 3, 2021

(30) Foreign Application Priority Data
Jul. 20, 2017 (CN) .......................... 201710594705.4

(51) Int. Cl.
*G06F 30/13* (2020.01)
*G06F 30/18* (2020.01)
*G08B 17/107* (2006.01)

(52) U.S. Cl.
CPC .............. *G06F 30/13* (2020.01); *G06F 30/18* (2020.01); *G08B 17/107* (2013.01)

(58) Field of Classification Search
CPC .......... G06F 30/13; G06F 30/18; G06F 17/18; G08B 17/107; G08B 29/18
(Continued)

(56) References Cited

U.S. PATENT DOCUMENTS 5,103,212 A    4/1992   Notarianni et al.
6,369,695 B1   4/2002   Horon
(Continued)

FOREIGN PATENT DOCUMENTS

CN    100405375 C    7/2008
CN    104122369 A    10/2014
(Continued)

OTHER PUBLICATIONS

Bourjoily et al., Using Simulated Annealing to Minimize the Cost of Centralized Telecommunications Networks, 1999, INFOR, Aug. 1999, 37, 3, pp. 271-296.*

(Continued)

*Primary Examiner* — Juan C Ochoa
(74) *Attorney, Agent, or Firm* — Cantor Colburn LLP

(57) ABSTRACT

A method of optimizing the layout of a smoke detection system in a space includes obtaining requirements for the smoke detection system, accessing a digital representation of physical and functional characteristics of the space, integrating the requirements and the digital representation of physical and functional characteristics of the space in a fiber deployment algorithm, determining a layout of smoke detection system components based on the fiber deployment algorithm, and installing the smoke detection system in the space according to the determined layout.

14 Claims, 5 Drawing Sheets

(58) Field of Classification Search
USPC .............................................................. 703/1
See application file for complete search history.

(56) References Cited

U.S. PATENT DOCUMENTS

| | | | |
|---|---|---|---|
| 7,301,641 B1* | 11/2007 | Overby | G01N 15/0205 |
| | | | 250/343 |
| 7,375,642 B2 | 5/2008 | Siemens et al. | |
| 8,035,527 B2 | 10/2011 | Powell | |
| 8,434,343 B2 | 5/2013 | Rossiter | |
| 9,170,574 B2 | 10/2015 | Fuller et al. | |
| 9,208,671 B2 | 12/2015 | Susel et al. | |
| 9,574,996 B2 | 2/2017 | Masumoto et al. | |
| 10,740,504 B2* | 8/2020 | Treptow | G06F 30/18 |
| 10,928,785 B2* | 2/2021 | Tiwari | G06Q 10/04 |
| 2006/0082456 A1* | 4/2006 | Marshall | G07F 19/207 |
| | | | 340/540 |
| 2012/0250722 A1* | 10/2012 | Barfoot | G08B 17/06 |
| | | | 374/1 |
| 2013/0110463 A1* | 5/2013 | Fee | G06F 17/18 |
| | | | 702/179 |
| 2015/0132691 A1 | 5/2015 | Zhou et al. | |
| 2017/0045415 A1 | 2/2017 | Williamson | |
| 2017/0286568 A1* | 10/2017 | Dean | G06F 30/13 |

FOREIGN PATENT DOCUMENTS

| | | | |
|---|---|---|---|
| CN | 104597207 B | 6/2016 | |
| CN | 205942988 U | 2/2017 | |
| SU | 1241272 | * 6/1984 | G08B 17/10 |

OTHER PUBLICATIONS

International Preliminary Report on Patentability for International Application No. PCT/US2018/042794; International Filing Date Jul. 19, 2018; dated Jan. 30, 2020.

International Search Report for International Application No. PCT/2018/042794; International Filing Date Jul. 19, 2018; dated Oct. 25, 2018; 5 pages.

Written Opinion for International Application No. PCT/2018/042794; International Filing Date Jul. 19, 2018; dated Oct. 25, 2018; 4 pages.

* cited by examiner

IMPLEMENTATION OF FIBER HIGH-SENSITIVITY SMOKE DETECTOR SYSTEM UTILIZING A BUILDING INFORMATION MODEL

CROSS REFERENCE TO RELATED APPLICATIONS

This application is a National Stage application of PCT/US2018/042794, filed Jul. 19, 2018, which claims priority to Chinese Patent Application No. 201710594705.4, filed Jul. 20, 2017, both of which are incorporated by reference in their entirety herein.

BACKGROUND

Exemplary embodiments pertain to the art of high-sensitivity smoke detector (HSSD) systems, and more particularly to the design and implementation of HSSD systems in buildings.

A typical Aspirating Smoke Detector (ASD) utilizes a network or series of pipes connected to a central unit to pull smoke/gas from a room for analysis. The pipe network collects air from the protected space through sampling holes. The pipe network may include holes spaced along length of pipe. It may also have multiple pipes with a single sampling hole or multiple sampling holes. The pipe transports the air from the protected space to the central unit via a pressure differential between the protected space and the central unit. The air-flow from the sampling holes to the central unit is governed by the pressure differential, the distance between sampling hole and central unit, number of connectors/bends and the piping material. These factors impact the transport time, limiting the overall size of an aspirating system. The layout of the pipe network is dictated by the codes and design limitations of the system.

BRIEF DESCRIPTION

In one embodiment, a method of optimizing the layout of a smoke detection system in a space includes obtaining requirements for the smoke detection system, accessing a digital representation of physical and functional characteristics of the space, integrating the requirements and the digital representation of physical and functional characteristics of the space in a fiber deployment algorithm, determining a layout of smoke detection system components based on the fiber deployment algorithm, and installing the smoke detection system in the space according to the determined layout.

Additionally or alternatively, in this or other embodiments a visual representation of the layout is defined via the fiber deployment algorithm.

Additionally or alternatively, in this or other embodiments the smoke detection system is a fiber optic high-sensitivity smoke detection (HSSD) system.

Additionally or alternatively, in this or other embodiments the fiber deployment algorithm utilizes variables including one or more of fiber type, node polish angle and direction, expected lighting in the space, and a smoke propagation simulation as variables in determining the layout.

Additionally or alternatively, in this or other embodiments the fiber deployment algorithm performs a linear regression to determine the layout.

Additionally or alternatively, in this or other embodiments the fiber deployment algorithm includes one or more of a simulated annealing algorithm, a genetic algorithm or a Monte Carlo algorithm.

Additionally or alternatively, in this or other embodiments the requirements include one or more of a smoke detection system cost, smoke detection performance targets, and identification of critical portions, structure or systems of the space.

Additionally or alternatively, in this or other embodiments the digital representation of physical and functional characteristics is a building information model.

In another embodiment, a smoke detection system includes a plurality of smoke detector system components installed in a space. A layout of the smoke detector system components in the space is determined via a system configured to obtain requirements for the smoke detection system, access a digital representation of physical and functional characteristics of the space, integrate the requirements and the digital representation of physical and functional characteristics of the space into a fiber deployment algorithm, and determine the layout of the smoke detection system components based on the fiber deployment algorithm.

Additionally or alternatively, in this or other embodiments the system is configured to define a visual representation of the layout via the fiber deployment algorithm.

Additionally or alternatively, in this or other embodiments the smoke detection system is a fiber optic high-sensitivity smoke detection (HSSD) system.

Additionally or alternatively, in this or other embodiments the fiber deployment algorithm utilizes variables including one or more of fiber type, node polish angle and direction, expected lighting in the space, and a smoke propagation simulation as variables in determining the layout.

Additionally or alternatively, in this or other embodiments the fiber deployment algorithm performs a linear regression to determine the layout.

Additionally or alternatively, in this or other embodiments the fiber deployment algorithm includes one or more of a simulated annealing algorithm, a genetic algorithm or a Monte Carlo algorithm.

Additionally or alternatively, in this or other embodiments the requirements include one or more of a smoke detection system cost, smoke detection performance targets, and identification of critical portions, structure or systems of the space.

Additionally or alternatively, in this or other embodiments the digital representation of physical and functional characteristics is a building information model.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Another type of smoke detector, a fiber high-sensitivity smoke detector (HSSD) utilizes a fiber optic network along which light signals are transmitted to nodes arranged in a room or other space. The light signal is emitted from the node and scattered or reflected back to the node. The scattered light signal is conveyed to a light detection device along the fiber optic network, and the scattered light signal is examined for characteristics indicative of the presence of smoke. Due to the characteristics of light transmission and scatter, for example, the criteria and parameters for the layout of an HSSD system in a room can be quite different from the criteria and parameters for the layout of a traditional ASD system in the same room.

A building information model (BIM) is a digital representation of physical and functional characteristics of a facility or building. As such, a BIM may serve as a shared knowledge resource for information about a facility and a reliable basis for decisions regarding the building and its systems from inception through the functional life of the building.

Figure 1:
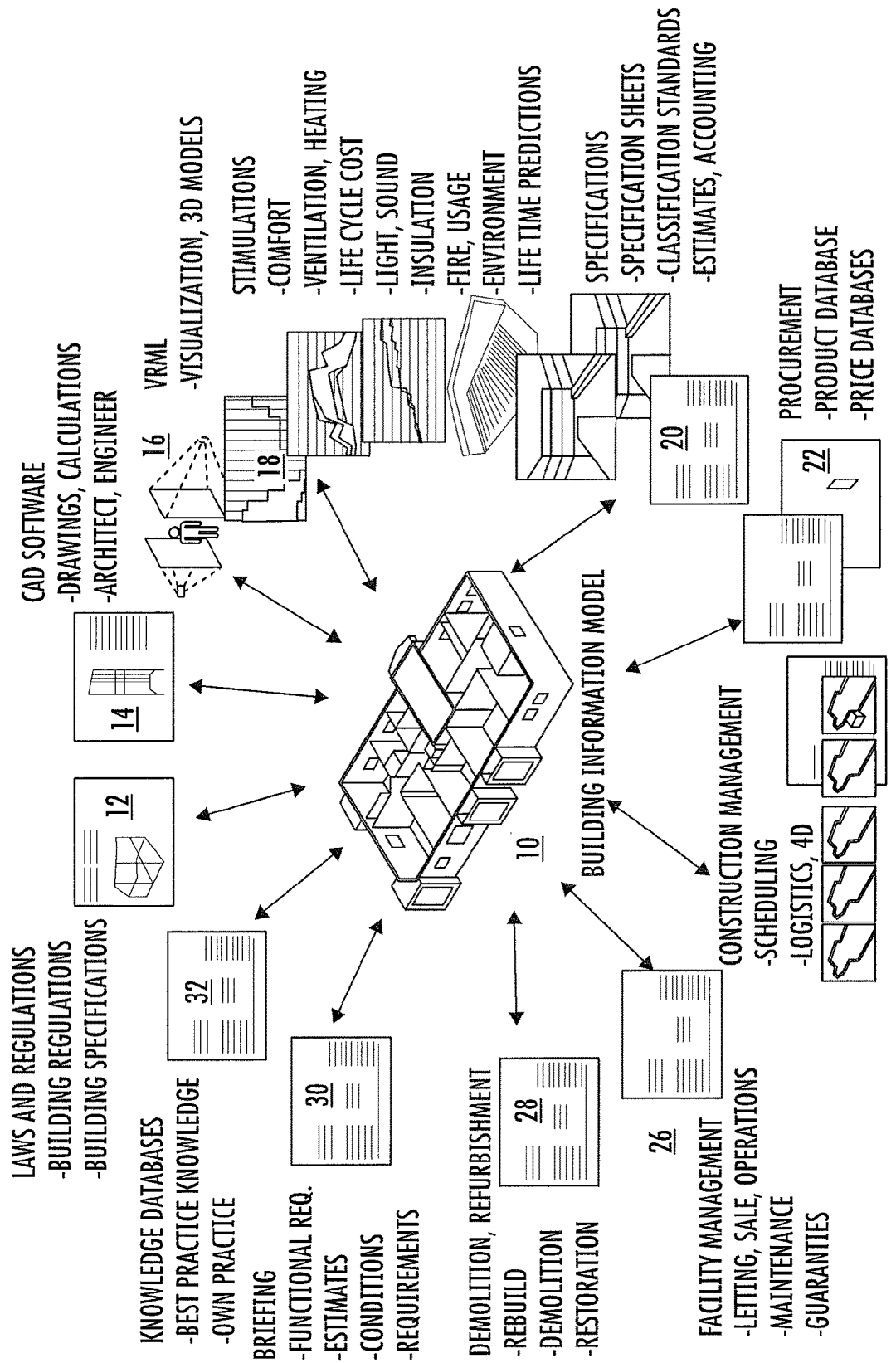
FIG. 1 is a schematic illustration of a building information model.

Referring now to FIG. 1, a schematic illustration of a visualization of a building information model (BIM) 10 is shown. The BIM 10 is constructed using various inputs shown schematically in FIG. 1. These inputs may include some or all of: laws and regulations 12, including building regulations and building specifications; computer-aided design (CAD) software inputs 14 including drawings and calculations such as those from architects, engineers, and specifiers; virtual-reality modelling language (VRML) elements, visualizations and 3D models 16; simulations 18, including those for comfort, ventilation, heating, light, sound, insulation, fire, environment, life cycle costs and lifetime predictions; specifications 20 including specification sheets, classification standards, estimates and accounting; procurement inputs 22, including product and cost databases; construction management 24, including scheduling and logistics; facility management 26 including letting, sale, operations, maintenance and guarantees; demolition and refurbishment 28 including rebuild information, demolition information and restoration information; briefing material 30 including functional requirements, estimates, conditions and other requirements; and knowledge databases 32 including best practices knowledge and own user or company practice knowledge. One skilled in the art will readily appreciate that the above elements are merely examples of elements that may together comprise a BIM 10, and other elements, additional elements or a subset of the above elements may be utilized in some embodiments.

Figure 2:
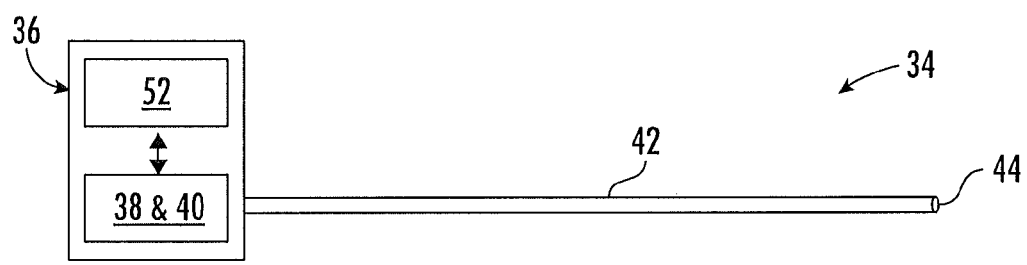
FIG. 2 is a schematic illustration of an embodiment of a high-sensitivity smoke detector (HSSD) system.

Referring now to FIG. 2, a schematic view of an embodiment of a fiber high-sensitivity smoke detector (HSSD) system 34 is illustrated. The HSSD system 34 includes a control system 36 having a light source 38 such as a laser diode, and a light sensitive device 40 such as a photodiode. The light source 38 and the light sensitive device 40 are operably connected to a processor 52. One or more fiber optic cables 42 are operably connected to the light source 38 and the light sensitive device 40. A node 44 is located at the termination point of the fiber optic cable 42 and in some instances may be understood to be part of the fiber optic cable 42. The node 44 is positioned in communication with the ambient atmosphere.

Figure 3:
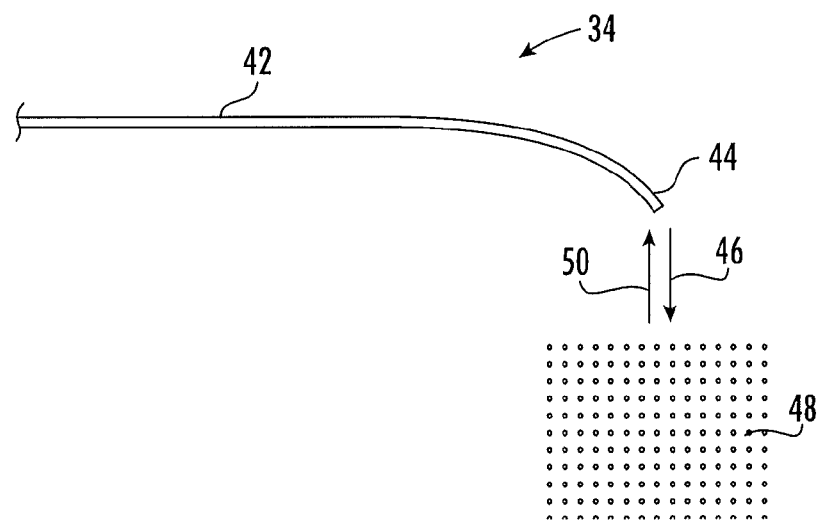
FIG. 3 is another schematic illustration of an embodiment of an HSSD system.

Referring now to FIG. 3, a light signal from the light source 38 is transmitted along the fiber optic cable 42 through the node 44 to the surrounding area, illustrated schematically at 46. The light 46 interacts with one or more particles indicative of a condition, illustrated schematically at 48, and is reflected or transmitted back to the node 44, illustrated schematically at 50. A comparison of the light provided to the node 44 and/or changes to the light reflected back to the light sensitive device 40 from the node 44 will indicate whether or not changes in the atmosphere are present in the ambient atmosphere adjacent the node 44 that are causing the scattering of the light. The scattered light as described herein is intended to additionally include reflected, transmitted, and absorbed light. Although the HSSD system 34 is described as using light scattering to determine a condition or event, embodiments where light obscuration, absorption, and fluorescence is used in addition to or in place of light scattering are also within the scope of the disclosure.

Figure 4:
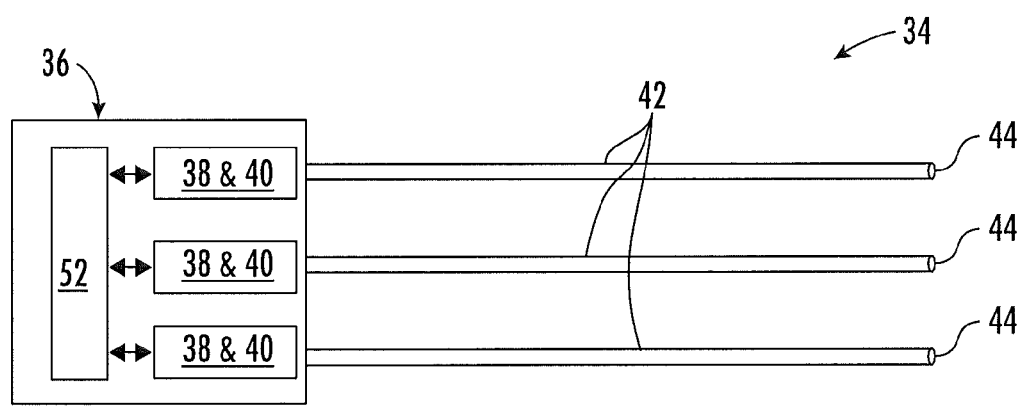
FIG. 4 is a schematic illustration of another embodiment of an HSSD system.
Figure 5:
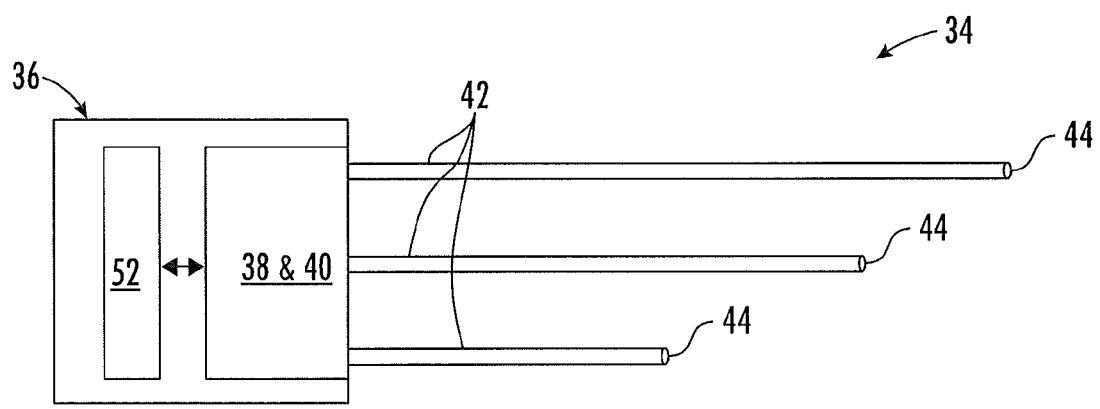
FIG. 5 is a schematic illustration of yet another embodiment of an HSSD system.

In another embodiment, the HSSD system 34 can include a plurality of nodes 44. For example, as illustrated in FIG. 4, a plurality of fiber optic cables 42 and corresponding nodes 44 are each associated with a distinct light sensitive device 40. In embodiments where an individual light sensitive device 40 is associated with each node 44, as shown in FIG. 4, the signal output from each node 44 can be monitored. Upon detection of a predetermined event or condition, it will be possible to localize the position of the event because the position of each node 44 within the system 34 is known. Alternately, as shown in FIG. 5, a plurality of fiber optic cables 42, may be coupled to a single light sensitive device 40.

In embodiments where a single light sensitive device 40 is configured to receive scattered light from a plurality of nodes 44, the control system 36 is able to localize the scattered light, i.e. identify the scattered light received from each of the plurality of nodes 44. In an embodiment, the control system 36 uses the position of each node 44, specifically the length of the fiber optic cables 42 associated with each node 44 and the corresponding time of flight (i.e. the time elapsed between when the light was emitted by the light source 38 and when the light was received by the light sensitive device 40), to associate different parts of the light signal with each of the respective nodes 44 that are connected to that light sensitive device 40. Alternatively, or in addition, the time of flight may include the time elapsed between when the light is emitted from the node and when the scattered light is received back at the node. In such embodiments, the time of flight provides information regarding the distance of a detected object or condition relative to the node.

Figure 6:
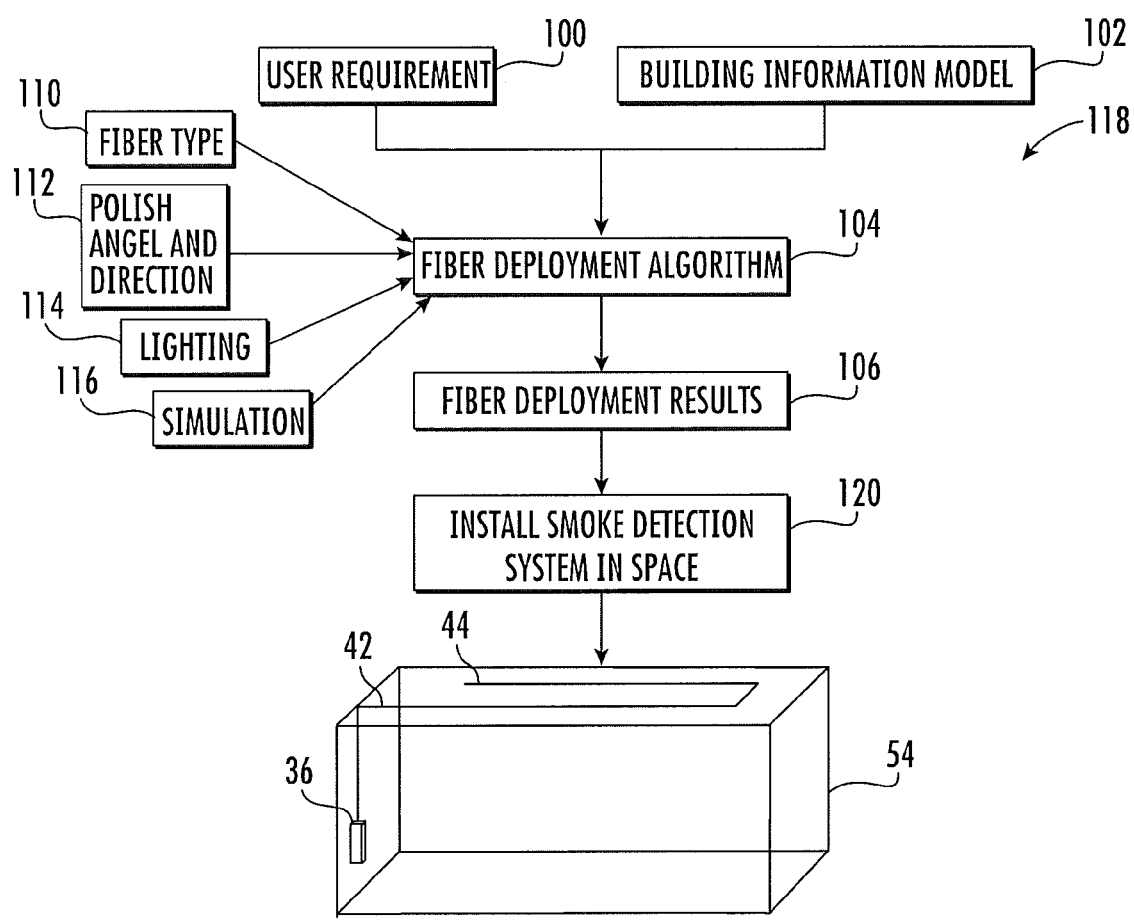
FIG. 6 is a schematic illustration of a method of determining and installing a layout of an HSSD system.

A building or other space 54 may utilize an HSSD system 34 having multiple fiber optic cables 42 and multiple nodes 44 to provide detection and monitoring to the desired space. Referring now to FIG. 6, a method 118 for deploying an HSSD system 34 utilizing the BIM 10 is illustrated. In block 100, the user requirements are obtained. These requirements may include cost targets, detection performance targets, identification of critical portions, structures or systems in the building or space 54, or the like. In block 102, the BIM 10 is accessed or obtained from, for example, a building owner, manager or contractor. Referring now to block 104, a fiber deployment algorithm utilizes the user requirements from block 100 and the BIM 10 from block 102 to provide a layout within building or space 54 of nodes 44 and fiber optic cables 42, and location within building or space 54 of the control system 36 which is optimized for cost, detection performance, etc. Use of the BIM allows the fiber deployment algorithm to take into account other building systems such as electrical wiring and HVAC locations, as well as locations of critical portions identified by the user in the user requirements, to determine the optimal layout of HSSD system 34 within building or space 54. Once the fiber deployment algorithm determines the layout at block 104, a visualization of the fiber deployment results may be produced at block 106. Such a visualization is a representation of the fiber deployment within building or space 54 based on inputted user requirements, such as detection targets. The HSSD system 34 is then installed in the building or space 54 according to the layout at block 120. The layout is stored on the BIM 10, and may be updated as needed, for example to reflect actual installation conditions of the HSSD system 34 in the building or space 54. Additionally, when the user requirements are changed, block 104 may be repeated, running the deployment algorithm based on the updated requirements, which may result in a different fiber deployment results visualized at block 106.

The fiber deployment algorithm 104 is, in some embodiments, a linear optimization. Further, in some embodiments, the fiber deployment algorithm 104 is a simulated annealing algorithm, a genetic algorithm or a Monte Carlo algorithm. Further, the fiber deployment algorithm 104 may perform the optimization based on a number of factors, such as cost and detection performance compared to a target, utilizing variables such as fiber type 110, polish angle and direction 112 of each node 44, decenter or tilt angle of the node 44 or the like (not shown), with such factors being able to be customized based on the requirements at each node 44 and the performance sought. Further, the deployment algorithm 104 may take into account such factors as expected lighting 114 of the space, for example, LED, fluorescent lamp, or sunlight, and may also utilize simulations 116 of, for example, smoke propagation though the space to determine an optimal fiber deployment. The generated fiber deployment results 106 may be added to the BIM 10. Once the HSSD system 34 is deployed within a building or space, and/or as the HSSD system 34 is updated over time, the BIM 10 may be further updated to reflect the deployed system.

The present disclosure provides a tool and method for providing an optimal layout of an HSSD system 34 that meets user requirements while maintaining low cost and a desired level of system performance. The method allows for a quick deployment of the HSSD system 34, along with the ability for quick and reliable updates to the deployment results due to real-world changes, updates to the BIM 10 or changes to user requirements.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A method of optimizing the layout of a smoke detection system in a space, comprising:
   obtaining requirements for the smoke detection system;
   accessing a digital representation of physical and functional characteristics of the space;
   integrating the requirements and the digital representation of physical and functional characteristics of the space in a fiber deployment algorithm;
   determining a layout of smoke detection system components based on the fiber deployment algorithm; and
   installing the smoke detection system in the space according to the determined layout;
   wherein the fiber deployment algorithm utilizes variables including one or more of, node polish angle and direction, expected lighting in the space, and a smoke propagation simulation as variables in determining the determined layout.

2. The method of claim 1, further comprising defining a visual representation of the determined layout via the fiber deployment algorithm.

3. The method of claim 1, wherein the smoke detection system is a fiber optic high-sensitivity smoke detection (HSSD) system.

4. The method of claim 1, wherein the fiber deployment algorithm performs a linear regression to determine the determined layout.

5. The method of claim 1, wherein the fiber deployment algorithm includes one or more of a simulated annealing algorithm, a genetic algorithm or a Monte Carlo algorithm.

6. The method of claim 1, wherein the requirements include one or more of a smoke detection system cost, smoke detection performance targets, and identification of critical portions, structure or systems of the space.

7. The method of claim 1, wherein the digital representation of physical and functional characteristics is a building information model.

8. A smoke detector system, comprising a plurality of smoke detector system components installed in a space, wherein a layout of the smoke detector system components in the space is determined via a determining system configured to:
   obtain requirements for the smoke detector system;
   access a digital representation of physical and functional characteristics of the space;
   integrate the requirements and the digital representation of physical and functional characteristics of the space into a fiber deployment algorithm; and
   determine the layout of the smoke detector system components based on the fiber deployment algorithm;
   wherein the fiber deployment algorithm utilizes variables including one or more of, node polish angle and direction, expected lighting in the space, and a smoke propagation simulation as variables in determining the determined layout.

9. The smoke detector system of claim 8, wherein the determining system is further configured to define a visual representation of the layout via the fiber deployment algorithm.

10. The smoke detector system of claim 8, wherein the smoke detector system is a fiber optic high-sensitivity smoke detection (HSSD) system.

11. The smoke detector system of claim 8, wherein the fiber deployment algorithm performs a linear regression to determine the layout.

12. The smoke detector system of claim 8, wherein the fiber deployment algorithm includes one or more of a simulated annealing algorithm, a genetic algorithm or a Monte Carlo algorithm.

13. The smoke detector system of claim 8, wherein the requirements include one or more of a smoke detector system cost, smoke detection performance targets, and identification of critical portions, structure or systems of the space.

14. The smoke detector system of claim 8, wherein the digital representation of physical and functional characteristics is a building information model.

\* \* \* \* \*